US008338818B1

(12) United States Patent
Hersee (10) Patent No.: US 8,338,818 B1
(45) Date of Patent: Dec. 25, 2012

(54) NANOWIRES, NANOWIRE NETWORKS AND METHODS FOR THEIR FORMATION AND USE

(75) Inventor: Stephen D. Hersee, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 376 days.

(21) Appl. No.: 12/635,151

(22) Filed: Dec. 10, 2009

Related U.S. Application Data

(60) Provisional application No. 61/203,137, filed on Dec. 19, 2008.

(51) Int. Cl.
*H01L 29/06* (2006.01)
(52) U.S. Cl. .......................................... 257/12; 977/763
(58) Field of Classification Search .................. 977/762, 977/763, 816; 257/9, 12, 347
See application file for complete search history.

(56) References Cited

U.S. PATENT DOCUMENTS

2005/0133476 A1* 6/2005 Islam et al. ...................... 216/2
2006/0073680 A1* 4/2006 Han et al. ..................... 438/479

OTHER PUBLICATIONS

R. Songmuang, O. Landré, and B. Daudin, From nucleation to growth of catalyst-free GaN nanowires on thin AlN buffer layer, Appl. Phys. Lett. 91, 251902 (2007).*
Stephen D. Hersee, Xinyu Sun, and Xin Wang, The Controlled Growth of GaN Nanowires, Nano Lett., 2006, 6 (8), pp. 1808-1811.*

* cited by examiner

*Primary Examiner* — Jenny L Wagner
*Assistant Examiner* — Mark Tornow
(74) *Attorney, Agent, or Firm* — MH2 Technology Law Group, LLP (57) ABSTRACT

Various embodiments provide non-planar nanowires, nanowire arrays, and nanowire networks as well as methods of their formation and applications. The non-planar nanowires and their arrays can be formed in a controlled manner on surfaces having a non-planar orientation. In embodiments, two or more adjacent nanowires from different surfaces can grow to merge together forming one or more nanowire branches and thus forming a nanowire network. In embodiments, the non-planar nanowires and nanowire networks can be used for cantilever oscillation, switching and transistor actions.

20 Claims, 5 Drawing Sheets

NANOWIRES, NANOWIRE NETWORKS AND METHODS FOR THEIR FORMATION AND USE

RELATED APPLICATIONS

This application claims priority from U.S. Provisional Patent Application Ser. No. 61/203,137, filed Dec. 19, 2008, which is hereby incorporated by reference in its entirety.

GOVERNMENT RIGHTS

This invention was made with Government support under Contract No. F49620-03-1-0013 awarded by the Air Force Office of Scientific Research (AFOSR). The U.S. Government has certain rights in this invention.

FIELD OF THE INVENTION

This invention relates generally to semiconductors and, more particularly, to semiconductor nanowires, nanowire arrays, and nanowire networks.

BACKGROUND OF THE INVENTION

Nanowires formed of Group III-N alloys (e.g., GaN) provide the potential for new semiconductor device configurations such as nanoscale optoelectronic devices. For example, GaN nanowires can provide large bandgap, high melting point, and chemical stability that is useful for devices operating in corrosive or high-temperature environments.

Conventional nanowire fabrication is based on a vapor-liquid-solid (VLS) growth mechanism and involves the use of catalysts such as Au, Ni, Fe, or In. Problems arise, however, because these conventional catalytic processes can not control the position and uniformity of the resulting nanowires. A further problem with conventional catalytic processes is that the catalyst is inevitably incorporated into the nanowires. This degrades the crystalline quality of the nanowires, which limits their applications.

Thus, there is a need to overcome these and other problems of the prior art and to provide high-quality nanowires, nanowire arrays, and nanowire networks. It is further desirable to provide non-planar nanowires with precise and uniform control of the geometry, position and crystallinity of each nanowire.

SUMMARY OF THE INVENTION

According to various embodiments, the present teachings include a nanowire device. The nanowire device can include a semiconductor layer disposed on a dielectric layer. The semiconductor layer can include one or more openings with each opening having a plurality of semiconductor sidewalls and exposing a portion of the underlying dielectric layer. A selective growth mask can be disposed on at least two of the semiconductor sidewalls having a plurality of Group III-N nanowires selectively disposed on each of at least two semiconductor sidewalls through the selective growth mask. The Group III-N nanowires can be oriented along a single direction on the same semiconductor sidewall and each nanowire maintains a constant cross-sectional feature.

According to various embodiments, the present teachings also include a method of making nanowires. In this method, a semiconductor layer can be provided on a dielectric layer. The semiconductor layer can include one or more openings with each opening having a plurality of semiconductor sidewalls and exposing a portion of the underlying dielectric layer. A selective growth mask can then be formed on at least two of the semiconductor sidewalls. The selective growth mask can include one or more patterned apertures with each patterned aperture exposing a portion of the underlying semiconductor sidewall. On the portion of the semiconductor sidewall that is exposed in each patterned aperture, a semiconductor material can be grown to form a nanowire having a constant cross-sectional feature.

According to various embodiments, the present teachings further include a nanowire device. The nanowire device can include a silicon-on-insulator substrate having an etched silicon layer on an oxide insulator. The etched silicon layer can include one or more openings with each opening having a plurality of silicon sidewalls and exposing a portion of the oxide insulator. A selective growth mask can be disposed on at least two of the silicon sidewalls. Within the selective growth mask provided can be a plurality of selected surface regions on the underlying silicon sidewall. A Group III-N nanowire can be extended from each of the plurality of selected surface regions and can be oriented along a single direction on the same silicon sidewall while maintaining a cross-sectional feature of the corresponding selected surface region. Adjacent nanowires on different silicon sidewalls of the at least two semiconductor sidewalls can merge into one or more nanowire branches.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Various embodiments provide non-planar nanowires, nanowire arrays, and nanowire networks as well as methods for their formation and applications. The non-planar nanowires and their arrays can be formed in a controlled manner on surfaces having a non-planar orientation. In embodiments, two or more adjacent nanowires from different surfaces can grow to merge together forming one or more nanowire branches and thus forming a nanowire network. For example, non-parallel nanowires can be made to connect forming a 3 or 4 terminal device. In embodiments, each nanowire can be formed with high-quality (i.e., essentially defect free) semiconductor material and with a precise control of the position, crystalline orientation, cross-sectional features, length and geometry.

FIGS. 1A-1D depict an exemplary method for forming non-planar nanowires in accordance with various embodiments of the present teachings.

Figure 1A:
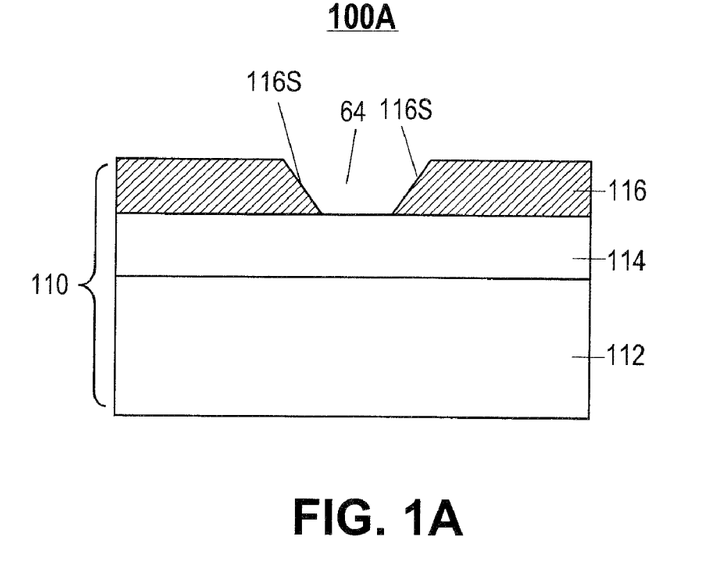
FIGS. 1A-1D depict an exemplary nanowire device at various stages of its formation in accordance with various embodiments of the present teachings.

In FIG. 1A, a substrate 110 can be provided. The substrate 110 can include a semiconductor layer 116 disposed on a dielectric layer 114, that is disposed on a substrate layer 112. In embodiments, the semiconductor layer 116 can include a material of, for example, Si, SiC, and III-V semiconductor compounds such as GaN or GaAs. The dielectric layer 114 can include any dielectric material, for example, $SiO_2$ or $SiN_X$ as known to one of ordinary skill in the art.

As shown, the semiconductor layer 116 can include one or more openings 64. Each opening 64 within the semiconductor layer 116 can be defined by a plurality of semiconductor sidewalls 116s and a portion of the underlying dielectric layer 114. In embodiments, the openings 64 can include various cross-sectional shapes defined by the semiconductor sidewalls 116s. For example, the opening 64 can include a trench having a trapezoid cross-sectional shape. In embodiments, the semiconductor sidewalls 116s can provide a suitable crystal plane for Group III-N nanowires to grow thereon. For example, the semiconductor sidewalls 116s can include a low-index crystal plane that is produced by, for example, a wet chemical etching.

In an exemplary embodiment, the substrate 110 can include a SOI substrate. For example, the SOI substrate can include an etched silicon layer on an oxide insulator that is in turn on a silicon substrate.

The etched silicon layer can be etched from a thick silicon layer of an SOI wafer to form various silicon blocks separated by openings within the thick silicon layer. The thick silicon layer or the etched silicon layer can have a thickness of, for example, about 20.0 nm to about 50.0 nm. The silicon blocks of the etched silicon layer can have silicon sidewalls, for example, formed or etched along one or more of the crystal planes of silicon. For example, the silicon sidewalls can be formed by a wet chemical etching having a Si(111) facet, where the Si(111) is at angle of about 54.7° with respect to the (001) Si plane of the etched silicon layer.

Figure 1B:
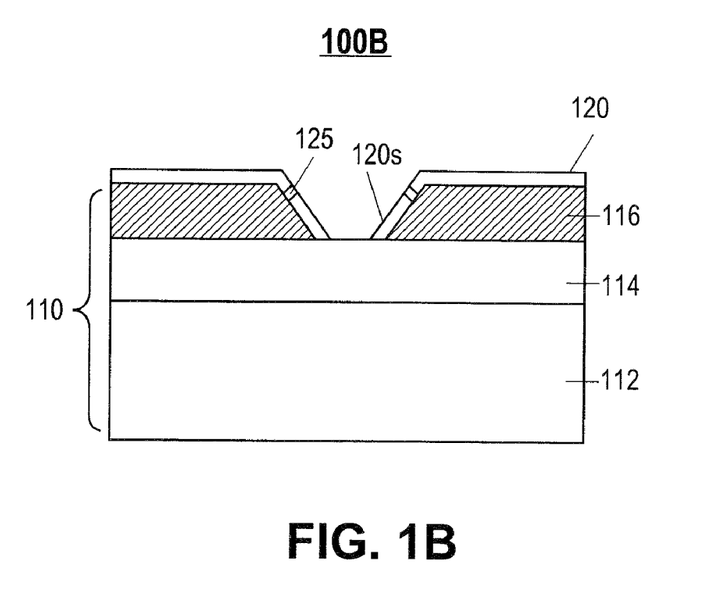

In FIG. 1B, a selective growth mask 120 can be formed on at least two of the semiconductor sidewalls 116s of the nanowire device 100A of FIG. 1A. In some cases as shown, the selective growth mask 120 can also be formed on the entire surface of the semiconductor layer 116. In embodiments, the exposed underlying dielectric layer 114 may or may not be covered by the selective growth mask. In various embodiments, the selective growth mask 120 can be made of any dielectric material and formed using techniques known to one of ordinary skill in the art. In various embodiments, the selective growth mask 120 can include a conducting material made of, for example, metal tungsten.

In embodiments, the selective growth mask 120 can have a thickness of, for example, about 100 nm or less, including about 30 nm or less, although other thicknesses in the range of about 10 nm to about 1000 nm can also be used.

The selective growth mask 120s on the semiconductor sidewalls 116s can further include one or more patterned apertures 125. Each patterned apertures 125 can expose a portion of the underlying semiconductor sidewall 116s. In embodiments, the selective growth mask 120s can be formed by, for example, patterning and etching a dielectric layer overlaying the silicon sidewalls 116s to form the apertures 125.

Figure 1C:
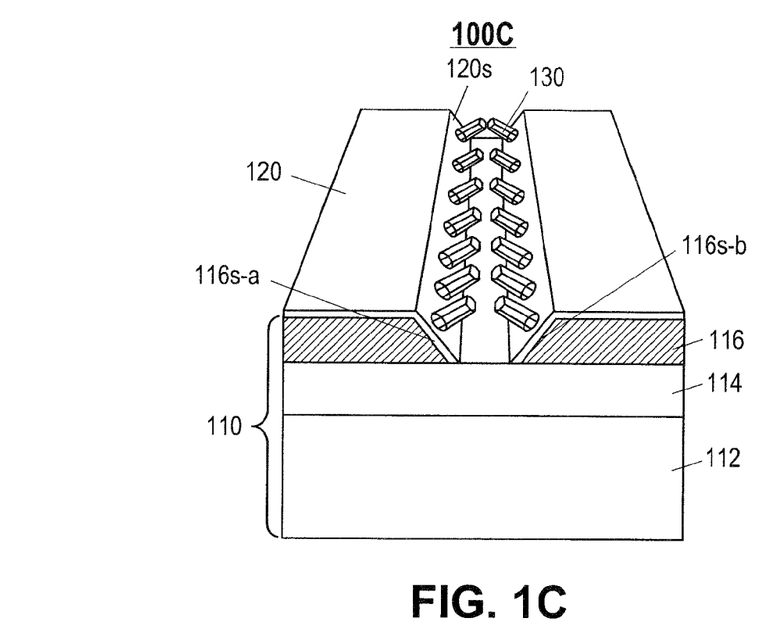
Figure 1D:
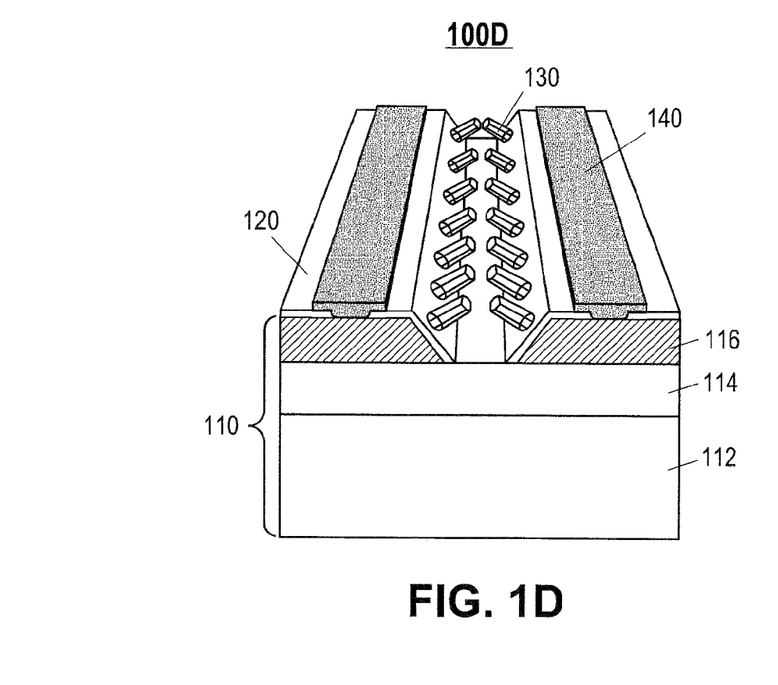

In FIG. 1C, nanowires 130 can then be selectively formed on semiconductor sidewalls 116s through the patterned apertures 125 of the selective growth mask 120s.

As used herein, the term "nanowire" refers to any elongated conductive or semiconductive material that includes at least one minor dimension, for example, one of the cross-sectional dimensions such as width or diameter, of less than or equal to about 1000 nm. In various embodiments, the minor dimension can be less than about 100 nm or less than about 10 nm, for example, about 1 nm to about 5 nm. In embodiments, the length of each nanowire can be, for example, about 10 nm to about 100 microns.

In embodiments, the nanowires can have an aspect ratio (e.g., length:width and/or major dimension:minor dimension) of about 5 or greater. In embodiments, the aspect ratio can be about 10 or greater, or about 100 or greater. In an exemplary embodiment, the cross-section of the nanowire can be highly asymmetric such that in one direction of the cross-sectional dimension can be much less than 1000 nm and in an orthogonal direction the dimension can be substantially greater than 1000 nm.

It is also intended that the term "nanowires" also encompass other elongated structures of like dimensions including, but not limited to, nanoshafts, nanopillars, nanoneedles, nanorods, and nanotubes (e.g., single wall nanotubes, or multiwall nanotubes), and their various functionalized and derivatized fibril forms, such as nanofibers in the form of thread, yarn, fabrics, etc.

In embodiments, the nanowires 130 can be made of, for example, Group III-V materials such as Group III-N semiconductor alloy compositions including, but not limited to, GaN, AlN, InN, InGaN, AlGaN, or AlInGaN.

In various embodiments, the nanowires can be formed by various crystal growth techniques including, but not limited to, metal-organic chemical vapor deposition (MOCVD) (also known as organometallic vapor phase epitaxy (OMVPE)), molecular-beam epitaxy (MBE), gas source MBE (GSMBE), metal-organic MBE (MOMBE), atomic layer epitaxy (ALE), or hydride vapor phase epitaxy (HVPE).

In embodiments, the nanowires 130 and their formation can include materials and methods as described in the related U.S. patent application Ser. No. 11/684,264, entitled "Pulsed Growth of GaN Nanowires and Applications in Group III Nitride Semiconductor Substrate Materials and Devices," which is hereby incorporated by reference in its entirety.

In embodiments, the nanowires 130 can include high-quality Group III-N nanowires forming Group III-N nanowire arrays and networks, wherein the position, orientation, cross-sectional features, length and/or the crystallinity of each nanowire can be precisely controlled. In embodiments, the nanowires 130 can have various cross-sectional shapes, such as, for example, rectangular, polygonal, square, oval, or circular shape.

In embodiments, each nanowire 130 can be formed by growing a semiconductor material, for example, a Group III-V material, on a portion of the semiconductor sidewall 116s that is exposed in each patterned aperture 125 of the selective growth mask 120s.

Specifically, a selective growth mode that is non-pulsed can be used to grow the semiconductor material on the exposed portion of the semiconductor sidewall 116s, followed by a growth-mode-transition from the selective growth mode to a pulsed growth mode. Semiconductor nanowire 130 can further be formed by continuing the pulsed growth mode of the semiconductor material to provide a length and a constant cross-sectional feature. That is, the cross-sectional features, for example, the cross-sectional dimensions (e.g., diameter or width) and the cross-sectional shapes, of each nanowire can be maintained by continuing the growth using the pulsed growth mode.

FIGS. 2A-2D depict various nanowires and arrays formed on the same sidewalls in accordance with various embodiments of the present teachings.

Figure 2A:
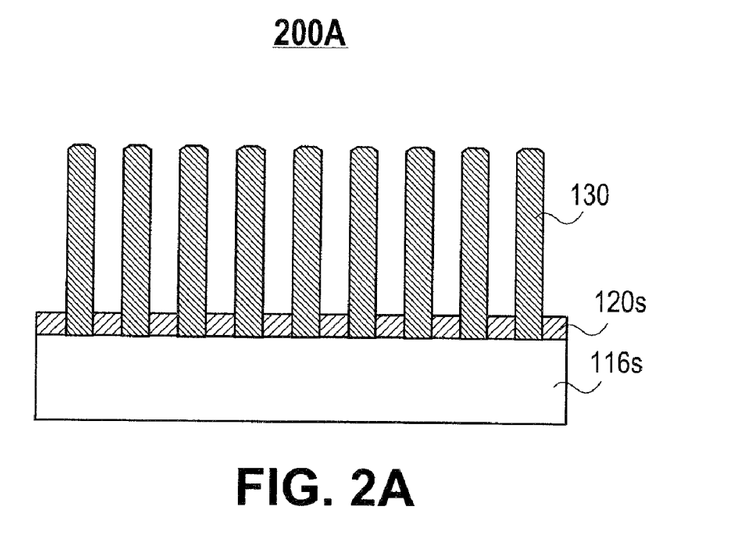
FIGS. 2A-2D depict exemplary nanowires in accordance with various embodiments.

In embodiments as shown in FIG. 2A, nanowires 130 can be epitaxially grown, e.g., by MOCVD, through each patterned aperture 125 of the selective growth mask 120s and on the exposed surface of the underlying semiconductor sidewalls 116s. In this case, the nanowire diameter can be controlled substantially similar to the diameter of the corresponding aperture. During the formation, a growth-mode transition from the non-pulsed growth mode to the pulsed growth mode can occur before growth of the semiconductor material protrudes over a top of the selective growth mask 120s, where semiconductor material deposited within the patterned aperture can be used as a nanowire nucleus providing a selected surface region for further formation.

Figure 2B:
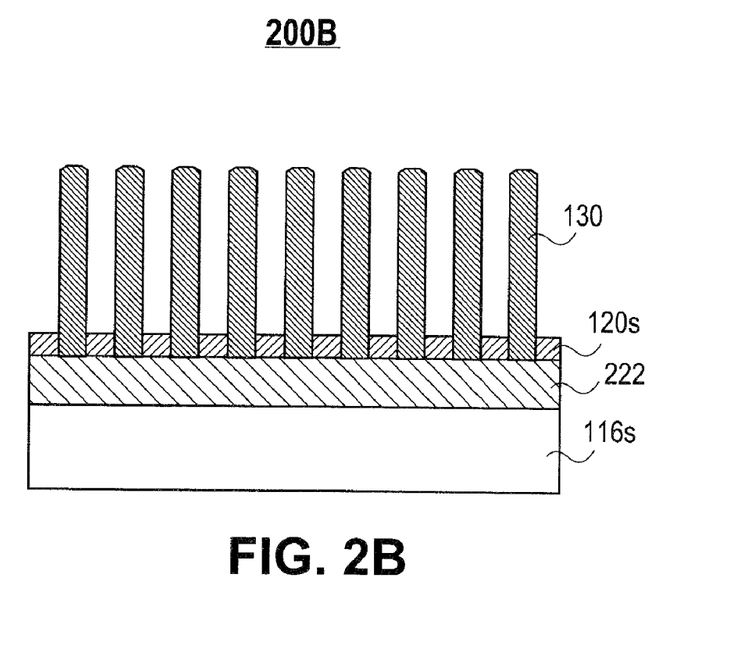

In embodiments as shown in FIG. 2B, a Group III-V, for example, a Group III-N buffer layer 222 such as a GaN layer can be formed between the semiconductor sidewalls 116s and the selective growth mask 120s. The nanowires 130 can be epitaxially grown on the Group III-N buffer layer 222 through the selective growth mask 120s.

Figure 2C:
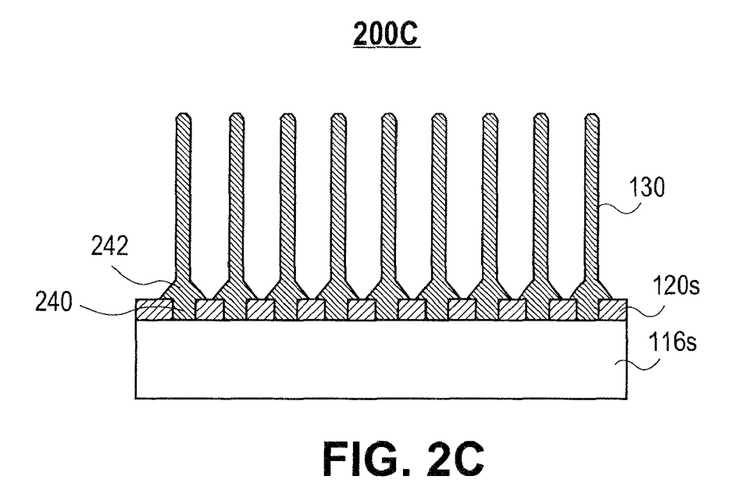
Figure 2D:
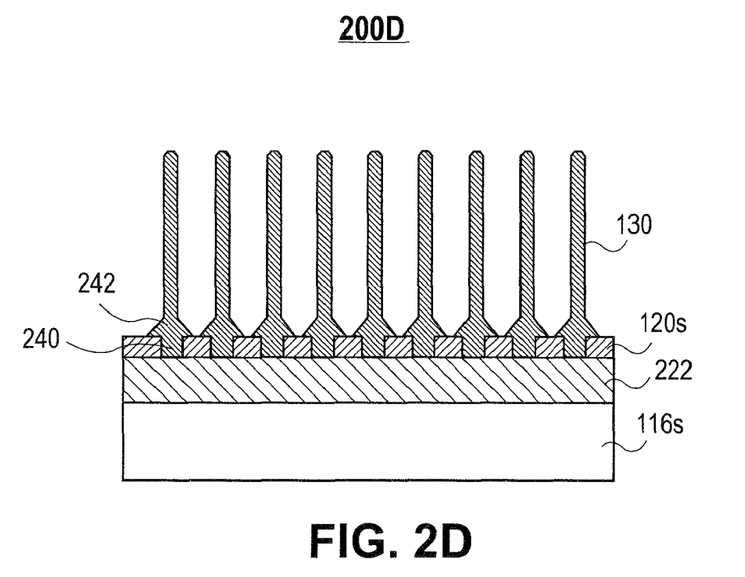

In embodiments of FIGS. 2C-2D, an increased duration can be used as compared to the methods and structures shown in FIGS. 2A-2B. As shown, nanostructure nuclei 240 can be formed within the patterned apertures 125 (see FIG. 1B) and protrude over the selective growth mask 120s and then spread laterally and vertically to form a truncated pyramid structure 242. The pyramid structure 242 can have sidewall facets of the $\{1\bar{1}00\}$ family and a top (0001) facet, which truncates the pyramid. As the pyramid structures 242 continue to grow, the diameter of this top (0001) facet can decrease and eventually this facet can disappear completely, for example, leaving a pyramid that is un-truncated.

In this case, the growth-mode transition from the non-pulsed growth mode to the pulsed growth mode can occur after growth of the semiconductor material protrudes over the top of the selective growth mask 120s to form the pyramid-shaped nanostructures 242, which can be truncated or un-truncated and can provide a selected surface region for further formation. Semiconductor nanowires can then be formed, e.g., on the top (0001) facet, by continuing the pulsed growth of the semiconductor material such that a cross-sectional feature of the semiconductor nanowire and a top facet of the pyramid-shaped nanostructures 242 are similar or substantially the same. Therefore, the dimensions and shapes of the exemplary III-N nanowires can be controlled.

In FIG. 2D, the nanowires 130 can be epitaxially grown on a Group III-N buffer layer 222 through the selective growth mask 120s. As similarly described in FIG. 2B, the Group III-N buffer layer 222 can be disposed between the semiconductor sidewall 116s and the selective growth mask 120s.

Referring back to FIG. 1C, the nanowires 130 formed on the same sidewalls 116s can be highly oriented in a single direction. For example, a GaN nanowire can be oriented along (0001) crystallographic direction. In embodiments, the nanowires 130 formed on the same sidewalls 116s can be lack of tapering and tangling, because the nanowires can remain attached to the parent substrate 110. In various embodiments, nanowires 130 formed on the same semiconductor sidewalls 116s can be, for example, substantially parallel. In embodiments, the nanowires 130 formed on the same sidewalls 116s can include, for example, one or more linear, square or hexagonal arrays with each array having a pitch (i.e., center-to-center spacing between any two adjacent nanowires) ranging from about 50 nm to about 10 µm. Because the plurality of sidewalls 116s of the semiconductor layer 116 covered by the selective growth mask 120s are non-planar, nanowires 130 formed on different sidewalls can be non-planar and the growth of adjacent nanowires from different sidewalls can be grown merging together and further forming a nanowire branch as shown in FIGS. 3A-3B.

Figure 3A:
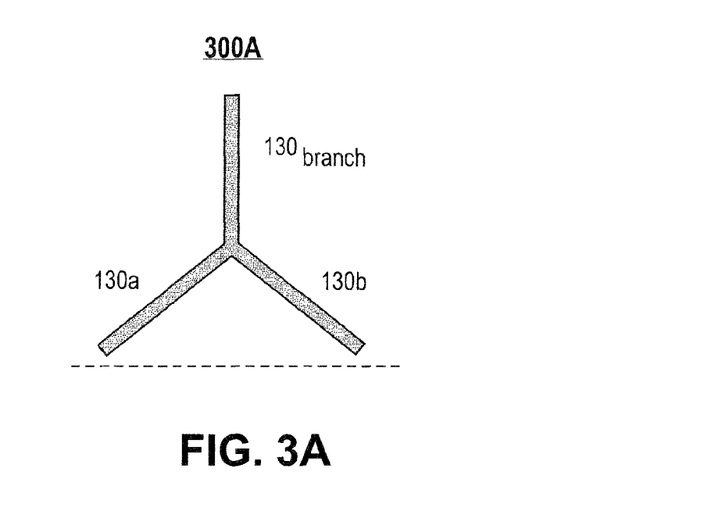
FIGS. 3A-3B depict exemplary nanowire networks in accordance with various embodiments of the present teachings.
Figure 3B:
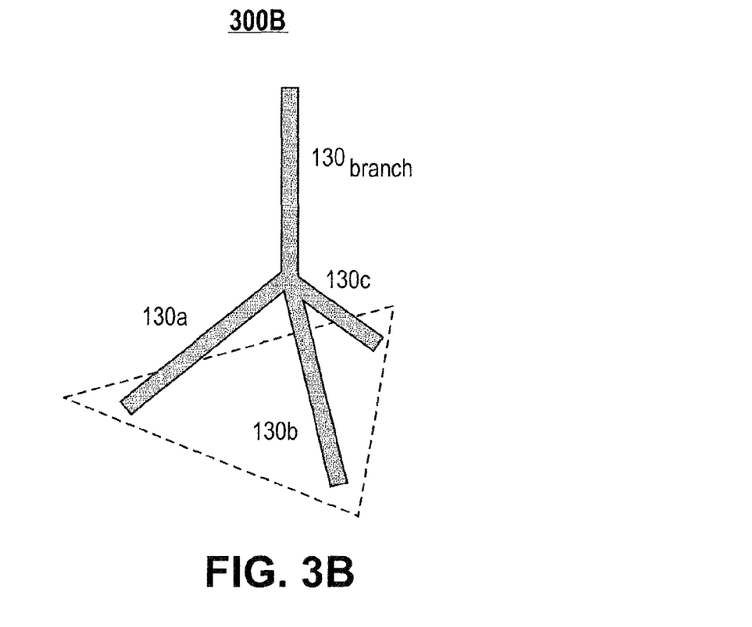

In FIG. 3A, the growth of a nanowire 130a formed on a first semiconductor sidewall 116s-a (see FIG. 1C) and the growth of a nanowire 130b on a second semiconductor sidewall 116s-b (see FIG. 1C) can be merged to create a third nanowire branch $130_{branch}$.

In embodiments, a number of non-planar nanowires can be grown merging together forming a nanowire branch. For example, in FIG. 3B, the growth of a nanowire 130a on a first semiconductor sidewall (not shown), the growth of a nanowire 130b on a second semiconductor sidewall (not shown), and the growth of a nanowire 130c on a third semiconductor sidewall (not shown) can be merged to create a fourth nanowire branch $130_{branch}$.

Additionally, nanowire branches $130_{branch}$ can also continue to grow, to merge together and to form a secondary generation of nanowire branches. Nanowire networks that include one or more nanowire branches can be formed.

Referring back to FIG. 1D, the exemplary substrate 110 can allow, for example, row(s) of nanowires 130 on the same sidewall to be biased via a contact pad 140. The contact pads 140 can include a metal or metal alloy as known to one of ordinary skill in the art. As shown, when adjacent nanowire tips from different sidewalls reach close proximity, field emission and/or Fowler-Nordheim conduction can occur between the two separate groups of nanowire rows. When a voltage pulse is applied to the contact pads 140, nanowires can attract and bend. However, when the voltage pulse is removed, the nanowires can oscillate at a mechanical frequency. For example, the nanowires can be used in MEMS devices as cantilever beams having oscillation frequencies of more than about 1 GHz.

In embodiments, because each nanowire can provide non-polar sidewalls, a core-shell growth can be performed to form, for example, non-planar core-shell nanowire structures. The core-shell growth on nanowires can include that similarly described in a related U.S. patent application Ser. No. 12/246,044, entitled "Nanowire and Larger GaN Based HEMTs," which is hereby incorporated by reference in its entirety.

In embodiments, each nanowire of the devices in FIGS. 1-3 can have a thin-walled structure as disclosed in a related U.S. patent application Ser. No. 12/237,469, entitled "Thin-Walled Structures," which is hereby incorporated by reference in its entirety.

In embodiments, the merged nanowire networks can be used for, for example, switching and transistor actions. In embodiments, the disclosed non-planar nanowires and nanowire networks can be used for various devices including, but not limited to light emitting devices (LEDs), lasers, high electron mobility transistors (HEMTs), MEMs devices or other suitable devices.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A nanowire device comprising:
   a semiconductor layer disposed on a dielectric layer, wherein the semiconductor layer further comprises one or more openings with each opening having a plurality of semiconductor sidewalls and exposing a portion of the underlying dielectric layer;
   a selective growth mask disposed on at least two of the semiconductor sidewalls; and
   a plurality of Group III-N nanowires selectively disposed on each of the at least two semiconductor sidewalls through the selective growth mask; wherein the Group III-N nanowires are oriented along a single direction on the same semiconductor sidewall and each nanowire maintains a constant cross-sectional feature, wherein adjacent Group III-N nanowires on different sidewalls of the at least two semiconductor sidewalls merge into a nanowire branch.

2. The device of claim 1, further comprising a nanowire network comprising one or more nanowire branches.

3. The device of claim 1, wherein the semiconductor layer disposed on the dielectric layer comprises a SOI (silicon-on-insulator) substrate.

4. The device of claim 1, wherein each semiconductor sidewall is a low-index crystal plane of the semiconductor layer.

5. The device of claim 1 further comprising a buffer layer disposed between the selective growth mask and the underlying semiconductor sidewall, wherein the buffer layer is made of a Group III-N material.

6. The device of claim 1, wherein the semiconductor layer comprises one or more materials selected from the group consisting of Si, SiC, GaN and GaAs.

7. The device of claim 1, wherein the constant cross-sectional feature of the Group III-N nanowires has a shape selected from the group consisting of a polygon, a rectangle, a square, an oval, and a circle.

8. The device of claim 1, wherein the Group III-N nanowires on the same sidewall forms a linear, square or hexagonal array having a pitch of about 50 nm to about 10 μm.

9. The device of claim 1, wherein the Group III-N nanowires are made of one or more materials selected from the group consisting of GaN, AlN, InN, InGaN, AlInGaN and AlGaN.

10. The device of claim 1, wherein each of the plurality of Group III-N nanowires has an aspect ratio of about 5 or higher and a cross-sectional dimension of about 1000 nm or less.

11. A nanowire device comprising:
    a silicon-on-insulator substrate comprising an etched silicon layer on an oxide insulator, wherein the etched silicon layer further comprises one or more openings with each opening having a plurality of silicon sidewalls and exposing a portion of the oxide insulator;
    a selective growth mask disposed on at least two of the silicon sidewalls; wherein a plurality of selected surface regions is within the selective growth mask and on the underlying silicon sidewall; and
    a Group III-N nanowire extending from each of the plurality of selected surface regions, wherein the Group III-N nanowires on the same silicon sidewall are oriented along a single direction and maintain a cross-sectional feature of the corresponding selected surface region, and wherein adjacent nanowires on different silicon sidewalls of the at least two semiconductor sidewalls merge into one or more nanowire branches.

12. The device of claim 11, wherein the one or more nanowire branches form a nanowire network, wherein the Group III-N nanowire comprises one or more materials selected from the group consisting of GaN, AlN, InN, InGaN, AlGaN, and AlInGaN.

13. The device of claim 11, wherein the plurality of selected surface regions comprises a Group III-N nanowire nucleus disposed within the selective growth mask and on the underlying semiconductor sidewall.

14. The device of claim 13, wherein each of the plurality of selected surface regions comprises a top facet of a pyramid-shaped Group III-N nanostructure that is disposed on the Group III-N nanowire nucleus.

15. A nanowire device comprising:
    a semiconductor layer disposed on a dielectric layer, wherein the semiconductor layer further comprises one or more openings with each opening having a plurality of semiconductor sidewalls and exposing a portion of the underlying dielectric layer;
    a selective growth mask disposed on at least two of the semiconductor sidewalls, the selective growth mask comprising one or more apertures through which regions of the semiconductor layer are exposed; and
    a plurality of Group III-N nanowires selectively disposed within the apertures on the exposed regions of the at least two semiconductor sidewalls; wherein the Group III-N nanowires are oriented along a single direction on the same semiconductor sidewall and each nanowire comprises a first portion comprising a tapered cross-section and a second portion having a constant cross-section extending from the tapered first portion.

16. The device of claim 15, wherein the tapered cross-section has a first width proximate the apertures and a second width proximate the second portion, the first width being larger than the second width.

17. The device of claim 16, wherein the one or more apertures of the mask have a third width, and further wherein the constant cross-sectional feature of the nanowire has a fourth width that corresponds to the third width, the fourth width being smaller than the third width.

18. The device of claim 15, wherein the first portion comprises a pyramid-shaped Group III-N nanostructure.

19. The device of claim 18, wherein the one or more nanowires comprise one or more materials selected from the group consisting of GaN, AlN, InN, InGaN, AlGaN, and AlInGaN.

20. The device of claim 18, wherein the exposed regions of the semiconductor layer comprise a Group III-N nanowire nucleus disposed within the selective growth mask apertures and on the underlying semiconductor sidewall.

* * * * *